(12) United States Patent
Cheng

(10) Patent No.: US 11,468,958 B1
(45) Date of Patent: Oct. 11, 2022

(54) SHIFT REGISTER CIRCUIT AND A METHOD FOR CONTROLLING A SHIFT REGISTER CIRCUIT

(71) Applicant: Winbond Electronics Corp., Taichung (TW)

(72) Inventor: Kan-Yuan Cheng, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 17/344,970

(22) Filed: Jun. 11, 2021

(51) Int. Cl.
*G11C 19/00* (2006.01)
*G11C 19/28* (2006.01)
*H03K 23/42* (2006.01)
*H03K 23/40* (2006.01)

(52) U.S. Cl.
CPC ........... *G11C 19/287* (2013.01); *G11C 19/28* (2013.01); *H03K 23/40* (2013.01); *H03K 23/425* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 5,289,518 A | 2/1994 | Nakao | |
| 5,670,904 A * | 9/1997 | Moloney | H03K 5/131 327/276 |
| 5,754,615 A * | 5/1998 | Colavin | H03K 21/40 377/116 |
| 6,009,139 A * | 12/1999 | Austin | H03K 23/66 327/115 |
| 6,204,707 B1 * | 3/2001 | Hamada | H03K 3/0375 327/202 |
| 6,630,853 B1 * | 10/2003 | Hamada | H03K 3/012 327/202 |
| 6,828,837 B2 * | 12/2004 | Ahn | H03K 3/037 327/202 |
| 7,420,391 B2 * | 9/2008 | Pesci | H03K 5/1534 326/46 |
| 7,880,519 B2 | 2/2011 | Senda et al. | |
| 8,023,612 B2 * | 9/2011 | Rose | G11C 19/00 377/70 |
| 8,644,106 B2 * | 2/2014 | Hwang | G11C 11/4093 365/233.1 |
| 8,654,226 B2 | 2/2014 | Decker | |
| 8,963,616 B2 * | 2/2015 | Degener | H02M 7/487 327/424 |
| 2004/0246810 A1 * | 12/2004 | Dike | G11C 7/222 365/233.1 |
| 2015/0030117 A1 * | 1/2015 | Zhang | H03K 21/38 377/47 |

FOREIGN PATENT DOCUMENTS

CN    100341043    10/2007
TW    I376879    11/2012

* cited by examiner

*Primary Examiner* — Tuan T Lam
(74) *Attorney, Agent, or Firm* — JCIPRNET

(57) ABSTRACT

A shift register circuit including a flip-flop chain and a control circuit is provided. The flip-flop chain is configured to receive an input signal and output an output signal. The control circuit is coupled to the flip-flop chain. The control circuit is configured to receive the input signal and the output signal and output a control signal to activate the flip-flop chain according to edge transitions of the input signal and the output signal. In addition, a method for controlling a shift register circuit is also provided.

15 Claims, 9 Drawing Sheets

SHIFT REGISTER CIRCUIT AND A METHOD FOR CONTROLLING A SHIFT REGISTER CIRCUIT

BACKGROUND

Technical Field

The invention relates to a shift register circuit and a method for controlling a shift register circuit.

Description of Related Art

A digital shift register is a common type of circuit for various applications. The digital shift register includes a chain of D-type flip-flops and operates according to an input clock. The input clock is inputted to a clock end of each D-type flip-flop. At a rising edge of the input clock, each flip-flop holds a data value presented in the input end D on the output end Q until the next rising edge of the input clock. However, the input clock of the flip-flops is always toggling even when inputs of D ends of the flip-flops do not change values. It will consume unnecessary power.

SUMMARY

The invention is directed to a shift register circuit, capable of being activated when necessary, and thus the power consumption of the shift register circuit can be reduced. In addition, a method for controlling a shift register circuit is also provided.

An embodiment of the invention provides a shift register circuit including a flip-flop chain and a control circuit. The flip-flop chain is configured to receive an input signal and output an output signal. The control circuit is coupled to the flip-flop chain. The control circuit is configured to receive the input signal and the output signal, and output a control signal to activate the flip-flop chain according to edge transitions of the input signal and the output signal.

In an embodiment of the invention, the edge transitions of the input signal and the output signal include start of shift events at the input signal and end of shift events at the output signal. The control circuit counts the start of shift events at the input signal and the end of shift events at the output signal. The control circuit outputs the control signal to activate the flip-flop chain when a first count number of the start of shift events at the input signal and a second count number of the end of shift events at the output signal are different.

In an embodiment of the invention, the control circuit includes a first counter circuit and a second counter circuit. The first counter circuit is coupled to the flip-flop chain. The first counter circuit is configured to receive the input signal, count the number of the start of shift events at the input signal and output the first count number. The second counter circuit is coupled to the flip-flop chain. The second counter circuit is configured to receive the output signal, count the number of the end of shift events at the output signal and output the second count number.

In an embodiment of the invention, the control circuit further includes a comparator circuit. The comparator circuit is coupled to the first counter circuit and the second counter circuit. The comparator circuit is configured to receive and compare the first count number and the second count number and output the control signal to activate the flip-flop chain when the first count number and the second count number are different.

In an embodiment of the invention, the comparator circuit outputs the control signal further according to an input clock.

In an embodiment of the invention, the control circuit receives an input clock and outputs the control signal further according to the input clock.

In an embodiment of the invention, the control circuit further includes a first detector circuit and a second detector circuit. The first detector circuit is coupled to the flip-flop chain and the first counter circuit. The first detector circuit is configured to detect the input signal and an output signal of a flip-flop of the flip-flop chain and output a first detecting signal to the first counter circuit. The first detecting signal indicates the start of shift events at the input signal. The second detector circuit is coupled to the flip-flop chain and the second counter circuit. The second detector circuit is configured to detect the output signal and output a second detecting signal to the second counter circuit. The second detecting signal indicates the end of shift events at the output signal.

In an embodiment of the invention, the start of shift events at the input signal indicates a change of value of the input signal, and the end of shift events at the output signal indicates a change of value of the output signal.

In an embodiment of the invention, a transition at a rising edge and a falling edge of the input signal is detected as the start of shift events, and a transition at a rising edge and a falling edge of the output signal is detected as the end of shift events.

In an embodiment of the invention, a transition at one of a rising edge and a falling edge of the input signal is detected as the start of shift events, and a transition at the other one of the rising edge and the falling edge of the output signal is detected as the end of shift events.

An embodiment of the invention provides a method for controlling a shift register circuit. The shift register circuit includes a flip-flop chain. The method includes: receiving an input signal and an output signal from the flip-flop chain; counting edge transitions of the input signal and the output signal, wherein the edge transitions of the input signal and the output signal comprise start of shift events at the input signal and end of shift events at the output signal; comparing a first count number of the start of shift events at the input signal and a second count number of the end of shift events at the output signal; and outputting a control signal to activate the flip-flop chain when the first count number and the second count number are different.

In an embodiment of the invention, the method for controlling the shift register circuit further includes: detecting the input signal and an output signal of a flip-flop of the flip-flop chain and outputting a first detecting signal to be counted, where the first detecting signal indicates the start of a shift event at the input signal; and detecting the output signal and outputting a second detecting signal to be counted, where the second detecting signal indicates the end of a shift event at the output signal.

In an embodiment of the invention, the method for controlling the shift register circuit further includes: receiving an input clock and outputting the control signal further according to an input clock.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated

DESCRIPTION OF THE EMBODIMENTS

Figure 1:
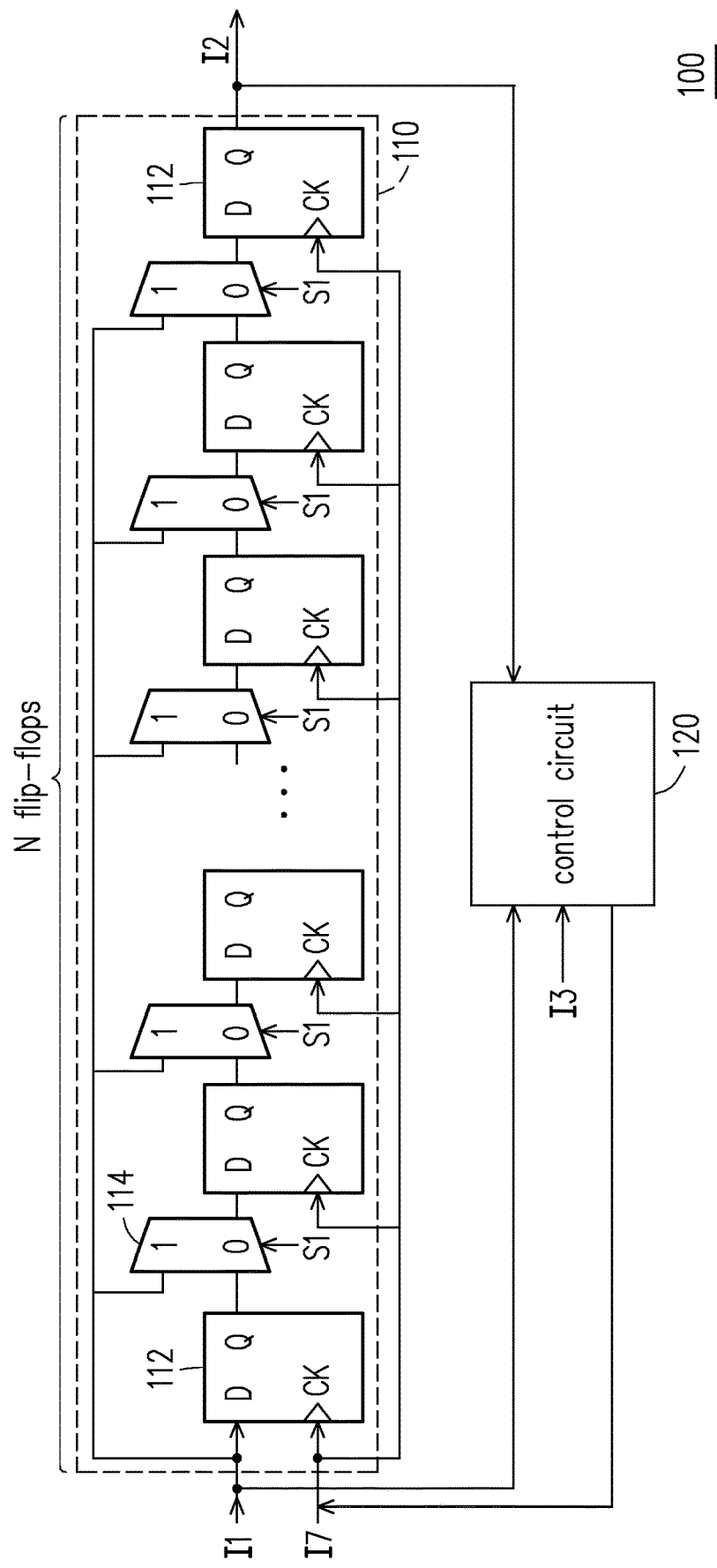
FIG. 1 illustrates a schematic diagram of a shift register circuit according to an embodiment of the invention.

FIG. 1 illustrates a schematic diagram of a shift register circuit according to an embodiment of the invention. Referring to FIG. 1, the shift register circuit 100 of the present embodiment includes a flip-flop chain 110 and a control circuit 120. The control circuit 120 is coupled to the flip-flop chain 110. The flip-flop chain 110 is configured to receive an input signal I1 and output an output signal I2. The control circuit 120 is configured to receive the input signal I1 and the output signal I2 and output a control signal I7 to activate the flip-flop chain 110 according to edge transitions of the input signal I1 and the output signal I2.

To be specific, the flip-flop chain 110 includes N flip-flops 112 coupled in series and multiplexer circuits 114, where N is an integer larger than 0. In the present embodiment, the flip-flops 112 are D-type flip-flops, for example. Each of the flip-flops 112 includes an input end D, an output end Q and a clock end CK. The input end D of each flip-flop 112 is connected to the output end Q of the previous flip-flop 112. The input signal I1 is inputted to the input end D of the first flip-flop 112, and the output signal I2 is outputted from the output end Q of the last flip-flop 112. The control signal I7 is inputted to the clock end CK of each flip-flop 112. At the rising edge of the control signal I7, the flip-flop chain 110 is activated, such that each flip-flop 112 holds a data value presented in the input end D on the output end Q until the next rising edge of the control signal I7.

The optional multiplexer circuits 114 are added to the flip-flop chain 110 for different latencies between the input signal I1 and the output signal I2. The multiplexer circuits 114 are added between two flip-flops as illustrated in FIG. 1. Depending on the desired latency between the input signal I1 and the output signal I2, selecting signals S1 can be changed to bypass certain numbers of the flip-flops 112. The selecting signals S1 for different multiplexer circuits 114 may be different, i.e. there are N−1 different selecting signals S1 signals, and one for each multiplexer circuit 114.

In the present embodiment, the edge transitions of the input signal I1 and the output signal I2 include start of shift events at the input signal I1 and end of shift events at the output signal I2. The control circuit 120 counts the number of start of shift events, which may be edge transitions of the input signal I1; and the number of end of shift events, which may be edge transitions of the output signal I2. The start of shift events at the input signal I1 indicates a change of value of the input signal I1, and the end of shift events at the output signal I2 indicates a change of value of the output signal I2. The control circuit 120 further receives an input clock I3 and outputs the control signal I7 to activate the flip-flop chain 110 when a first count number of the start of shift events at the input signal I1 and a second count number of the end of shift events at the output signal I2 are different. The control circuit 120 may output the control signal I7 further according to the input clock I3. Therefore, the control signal I7 toggles to activate the flip-flop chain 110 when the counts are different. In an embodiment, the control signal I7 may be a gated clock. The flip-flop chain 110 does not always work, such that the power consumption of the shift register circuit 100 can be reduced.

Figure 2:
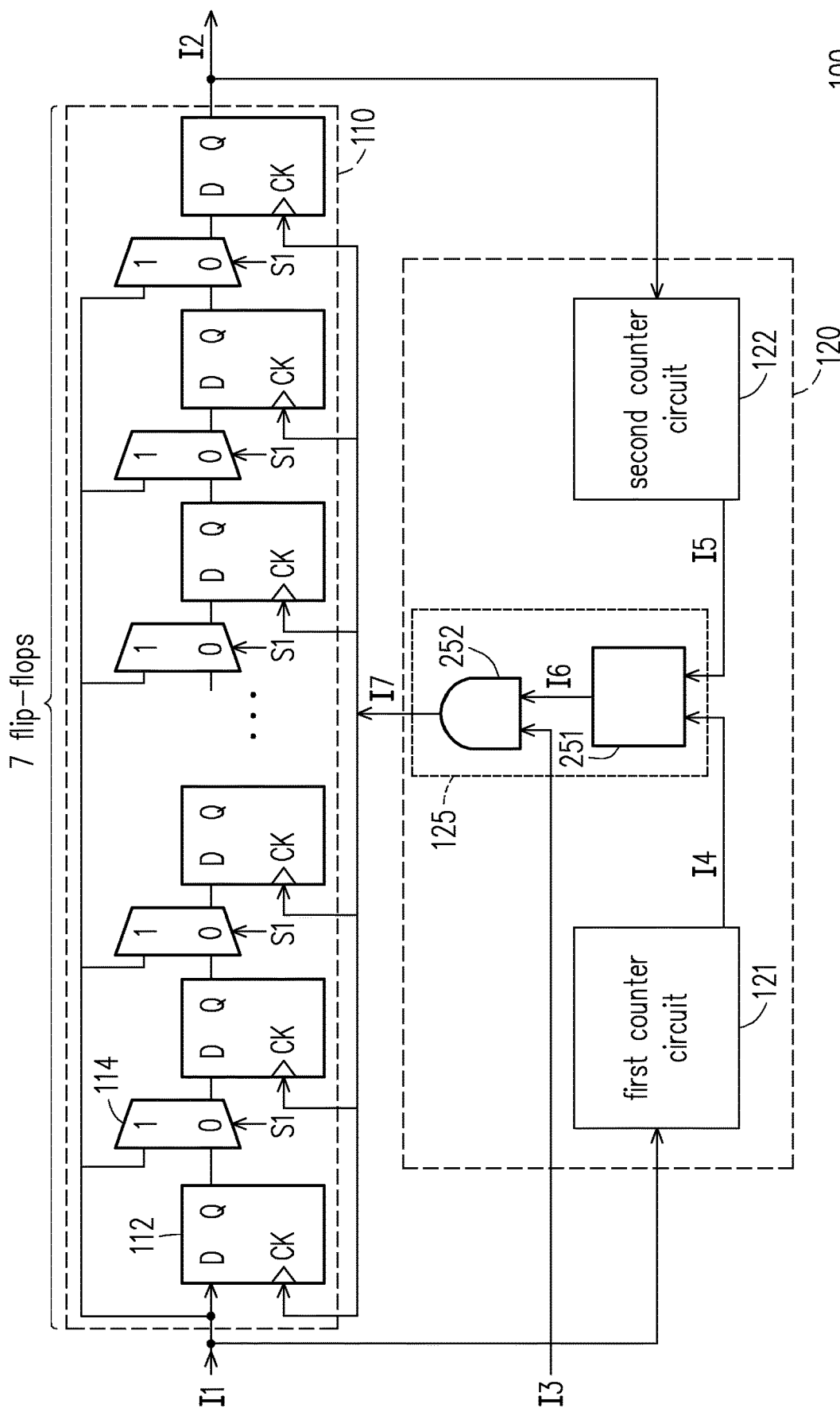
FIG. 2 illustrates a schematic diagram of a shift register circuit according to another embodiment of the invention.

FIG. 2 illustrates a schematic diagram of a shift register circuit according to another embodiment of the invention. Referring to FIG. 2, taking 7 flip-flops in the flip-flop chain 110 for example, the control circuit 120 of the present embodiment includes a first counter circuit 121, a second counter circuit 122 and a comparator circuit 125. The first counter circuit 121 is coupled to the flip-flop chain 110. The first counter circuit 121 is configured to receive the input signal I1, count the number of start of shift events, which may be edge transition of the input signal I1 and output a counting signal I4 including information of the first count number. The second counter circuit 122 is coupled to the flip-flop chain 110. The second counter circuit 122 is configured to receive the output signal I2, count the number of end of shift events, which may be edge transition of the output signal I2 and output a counting signal I5 including information of the second count number.

For shift register applications in which the input signal I1 stays in logic state 0 (or logic state 1) when the input signal is inactive, and switch to opposite logic state, logic state 1 (or logic state 0) when active and stay in the opposite logic state for a smaller number of cycles, for example, 2 cycles, the start of a shift events can be defined as the rising edge of the input signal I1, and the end of a shift event can be defined as the falling edge of output signal I2. The first counter circuit 121 and the second counter circuit 122 can be implemented by using a well-known counter circuit in the art.

The comparator circuit 125 is coupled to the first counter circuit 121 and the second counter circuit 122. The comparator circuit 125 is configured to receive the counting signals I4 and I5. The comparator circuit 125 is further configured to compare the first count number and the second count number and output the control signal I7 to activate the flip-flop chain 110 when the first count number and the second count number are different. To be specific, the comparator circuit 125 includes a comparator 251 and an AND gate 252. The comparator 251 can be implemented by using a well-known digital comparator circuit in the art. The comparator 251 receives the counting signals I4 and I5 and compares the first count number and the second count number. The comparator 251 outputs a comparison signal I6 including information of a comparison result to the AND gate 252. The AND gate 252 receives the comparison signal I6 and an input clock I3. The AND gate 252 outputs the control signal I7 according to logical states of the comparison signal I6 and the input clock I3. That is to say, the comparator circuit 125 outputs the control signal I7 further according to the input clock I3.

Figure 3:
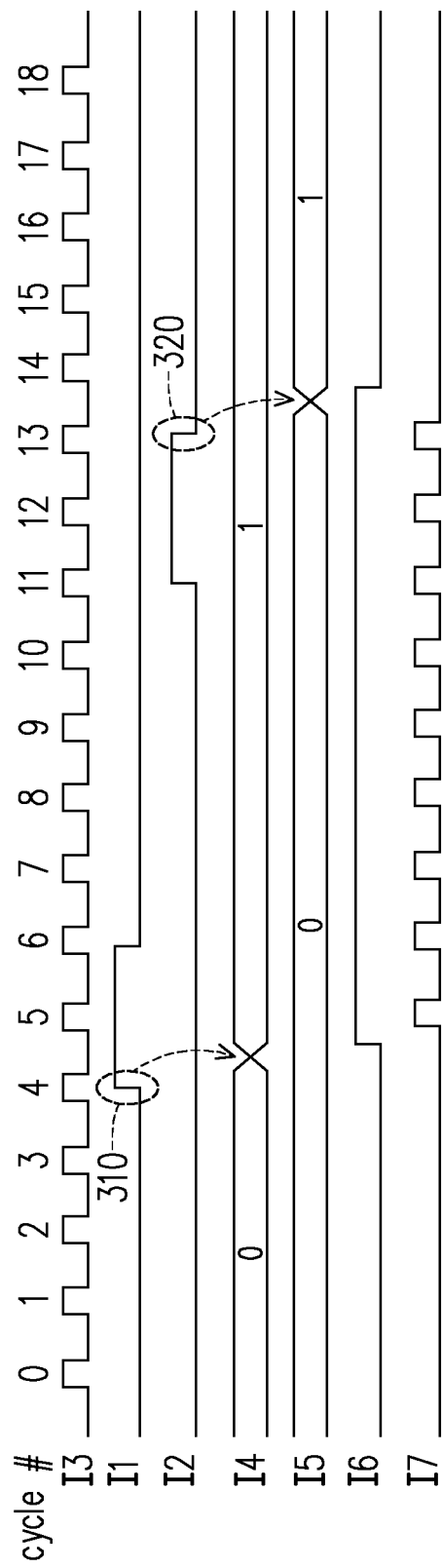
FIG. 3 illustrates a waveform diagram of the shift register circuit depicted in FIG. 2 according to an embodiment of the invention.

FIG. 3 illustrates a waveform diagram of the shift register circuit depicted in FIG. 2 according to an embodiment of the invention. Referring to FIG. 2 and FIG. 3, the transition at the rising edge 310 of the input signal I1 indicates a change of value of the input signal I1, e.g. from inactive logical state 0 (low level) to logical state 1 (high level). The first counter circuit 121 outputs the counting signal I4 including the first count number equal to 1 after the cycle number 5.

On the other hand, the transition at the falling edge 320 of the output signal I2 indicates a change of value of the output signal I2, e.g. from logical state 1 to logical state 0. The second counter circuit 122 outputs the counting signal I5 including the second count number equal to 1 after the cycle number 14.

During the period of the cycle numbers 5 to 13, the first count number is equal to 1 and the second count number is equal to 0. The first count number and the second count number are different, and thus the comparator circuit 125 outputs the control signal I7 as a clock signal to activate the flip-flop chain 110 to work. The control signal I7 toggles when the contents of the input counter and the output counter are not the same. In the present embodiment, one shift event is illustrated in FIG. 3. The transition at the rising edge 310 of the input signal I1 is detected as a start of a shift event, and the transition at the falling edge 320 of the output signal I2 is detected as an end of the shift event.

Figure 4:
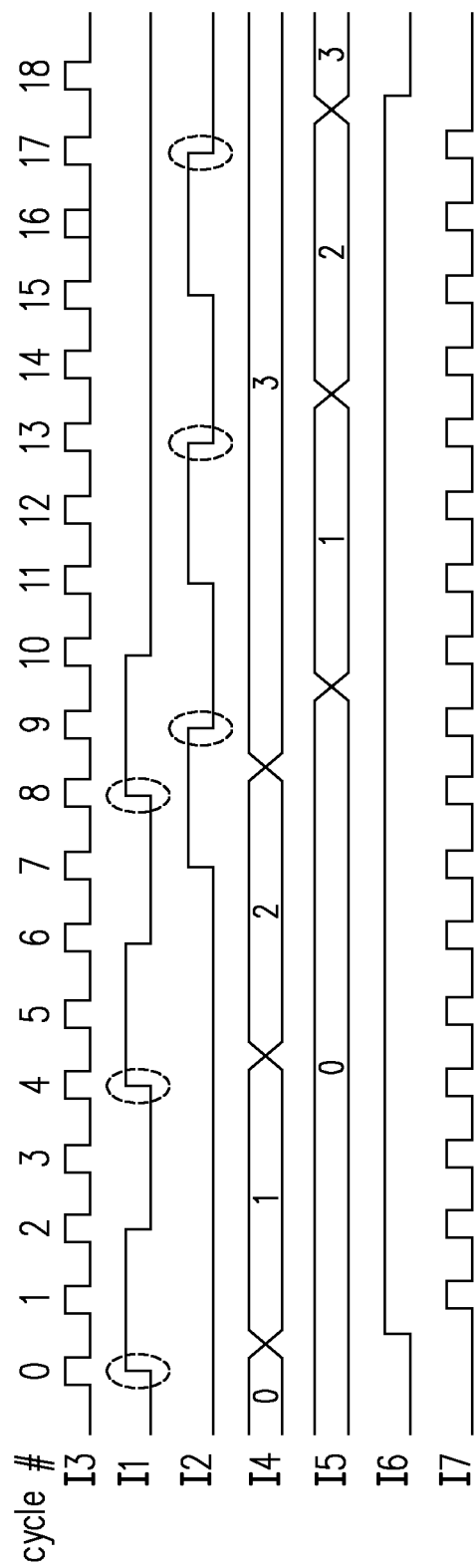
FIG. 4 illustrates a waveform diagram of the shift register circuit depicted in FIG. 2 according to another embodiment of the invention.

FIG. 4 illustrates a waveform diagram of the shift register circuit depicted in FIG. 2 according to another embodiment of the invention. Referring to FIG. 2 and FIG. 4, three shift events are illustrated in FIG. 4. The length of logical state 1 of the input signal I1 is fixed as two cycles, and the minimum length of logical state 0 of the input signal I1 is two cycles.

In the present embodiment, the first counter circuit 121 increments when there is a rising edge in the input signal I1, and the second counter circuit 122 increments when there is a falling edge in the output signal I2. During the period of the cycle numbers 1 to 17, the first count number and the second count number are different, and thus the comparator circuit 125 output the control signal I7 as a clock signal to activate the flip-flop chain 110 to work. The control signal I7 toggles when the contents of the input counter and the output counter are not the same.

In addition, enough teaching, suggestion, and implementation illustration for hardware structures of the first counter circuit 121 and the second counter circuit 122 can be obtained with reference to common knowledge in the related art.

In the embodiments of FIG. 3 and FIG. 4, a transition at the rising edge of the input signal is detected as the start of shift events, and a transition at the falling edge of the output signal is detected as the end of shift events, but the invention is not limited thereto. In an embodiment, a transition at the falling edge of the input signal may be detected as the start of shift events, and a transition at the rising edge of the output signal may be detected as the end of shift events. That is to say, a transition at one of a rising edge and a falling edge of the input signal can be detected as the start of shift events, and a transition at the other one of the rising edge and the falling edge of the output signal can be detected as the end of shift events.

Figure 5:
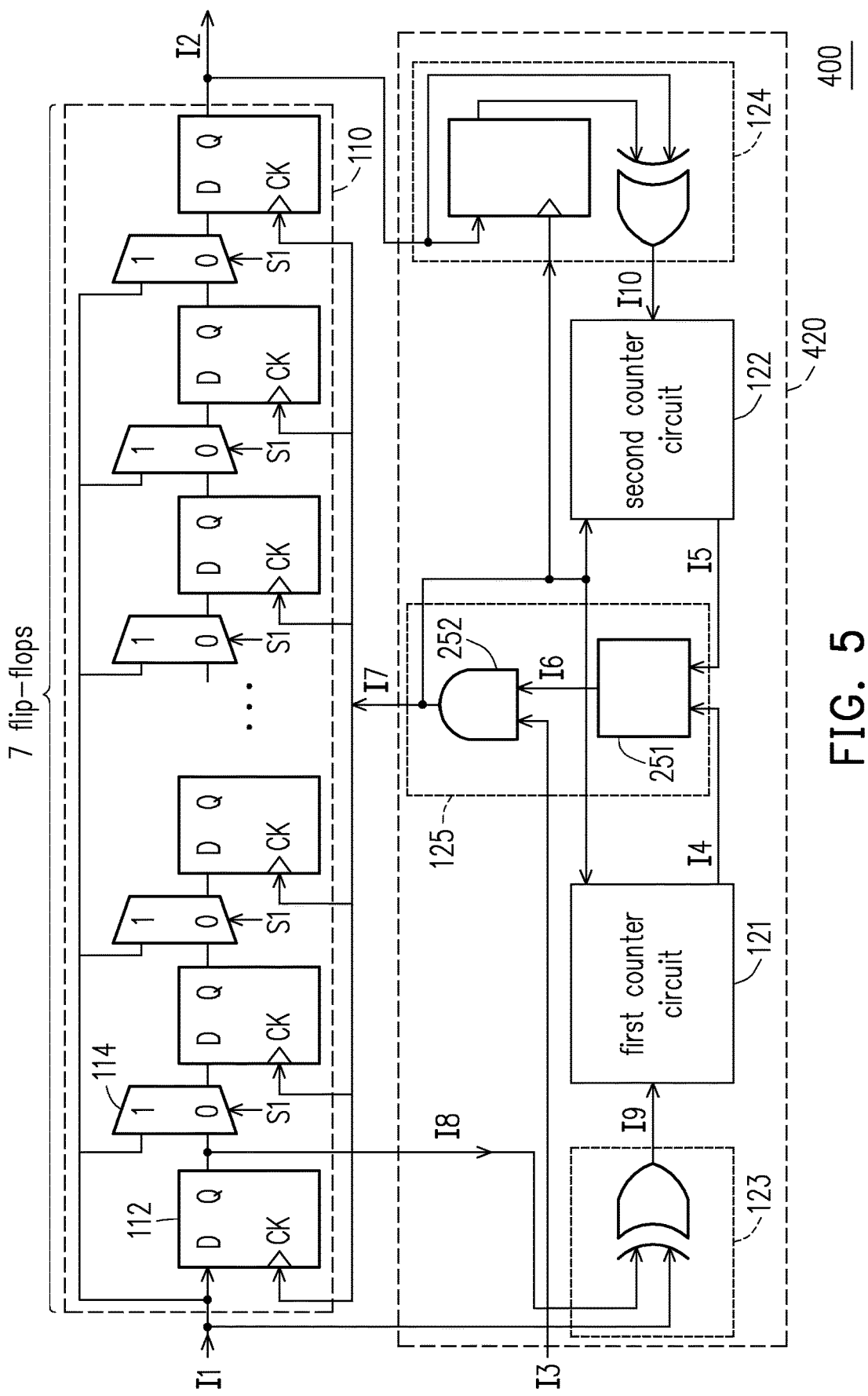
FIG. 5 illustrates a schematic diagram of a shift register circuit according to another embodiment of the invention.

FIG. 5 illustrates a schematic diagram of a shift register circuit according to another embodiment of the invention. Referring to FIG. 2 and FIG. 5, the shift register circuit 400 of FIG. 5 is similar to the shift register circuit 100 of FIG. 2, and the main difference therebetween lies in that the control circuit 420 further includes a first detector circuit 123 and a second detector circuit 124.

To be specific, the first detector circuit 123 is coupled to the flip-flop chain 110 and the first counter circuit 121. The first detector circuit 123 includes an XOR gate. The first detector circuit 123 is configured to detect the input signal I1 and an output signal I8 of the first flip-flop 112 of the flip-flop chain 110. Different logic states of I1 and I8 indicate a transition of I1 and are start of shift events. The first detector circuit 123 is further configured to output a first detecting signal I9 to the first counter circuit 121. The first detecting signal I9 indicates the edge transition of the input signal I1.

The second detector circuit 124 is coupled to the flip-flop chain 110 and the second counter circuit 122. The second detector circuit 124 includes an XOR gate and a flip-flop. The flip-flop may be a D-type flip-flop. The second detector circuit 124 is configured to detect the output signal I2 and output a second detecting signal I10 to the second counter circuit 122. The second detecting signal I10 indicates the edge transition of the output signal I2 as end of a shift event. The second detector circuit 124 is activated by the control signal I7.

Figure 6:
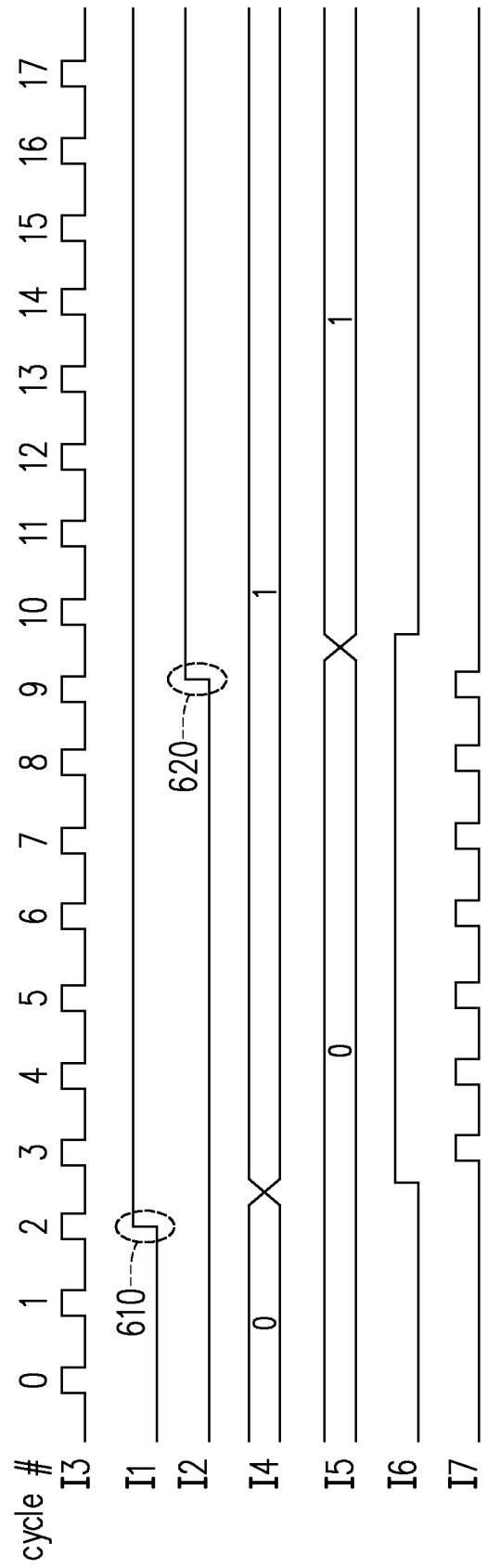
FIG. 6 illustrates a waveform diagram of the shift register circuit depicted in FIG. 5 according to an embodiment of the invention.

FIG. 6 illustrates a waveform diagram of the shift register circuit depicted in FIG. 5 according to an embodiment of the invention. Referring to FIG. 5 and FIG. 6, when the input signal I1 changes from logical state 0 to logical state 1, the output of the XOR gate will be 1, and the first counter circuit 121 will be incremented by 1. That is to say, the first counter circuit 121 increments when the output of the XOR gate is high. Similarly, the second counter circuit 122 increments when the output of the XOR gate is high.

During the period of the cycle numbers 3 to 9, the first count number is equal to 1 and the second count number is equal to 0. The first count number and the second count number are different, and thus the comparator circuit 125 outputs the control signal I7 as a clock signal to activate the flip-flop chain 110 to work. In the present embodiment, one shift event is illustrated in FIG. 6. The transition at the rising edge 610 of the input signal I1 is detected as a start of a shift event, and the transition at the rising edge 620 of the output signal I2 is detected as an end of the shift event.

Figure 7:
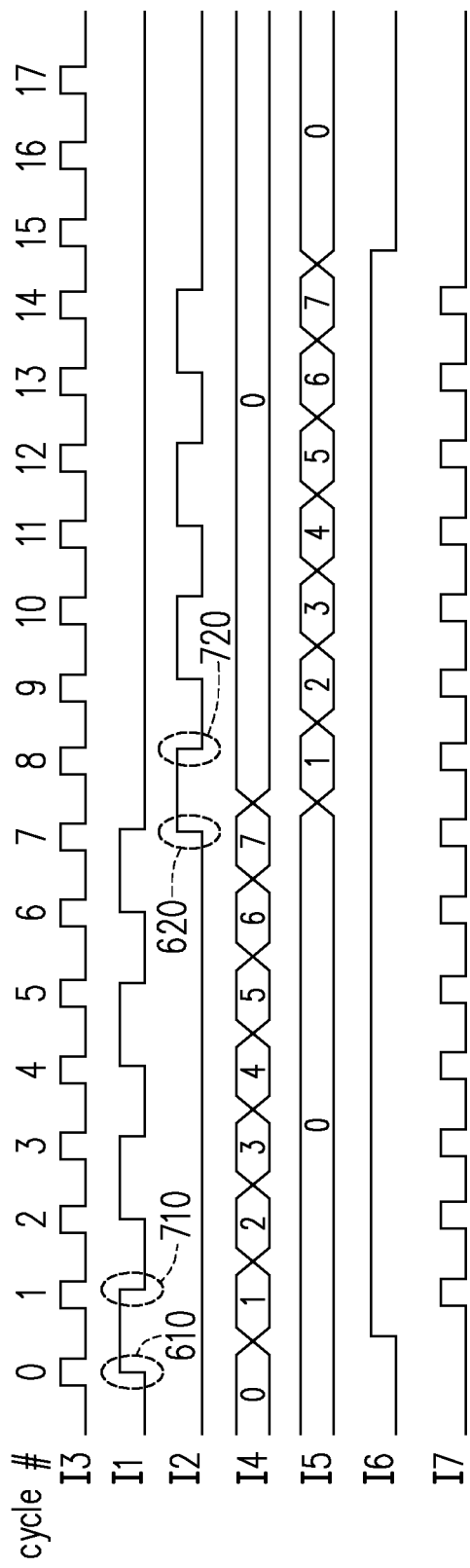
FIG. 7 illustrates a waveform diagram of the shift register circuit depicted in FIG. 5 according to another embodiment of the invention.

FIG. 7 illustrates a waveform diagram of the shift register circuit depicted in FIG. 5 according to another embodiment of the invention. Referring to FIG. 5 and FIG. 7, when the input signal I1 changes from logical state 0 to logical state 1, or from logical state 1 to logical state 0, the output of the XOR gate of the first detector circuit 123 will be 1, and the first counter circuit 121 will be incremented by 1. Similarly, when the output signal I2 changes from logical state 0 to logical state 1, or from logical state 1 to logical state 0, the output of the XOR gate of the second detector circuit 124 will be 1, and the second counter circuit 122 will be incremented by 1.

During the period of the cycle numbers 1 to 14, the first count number and the second count number are different, and thus the comparator circuit 125 output the control signal I7 as a clock signal to activate the flip-flop chain 110 to work. The control signal I7 toggles when the contents of the input counter and the output counter are not the same.

In the present embodiment, eight shift events are illustrated in FIG. 7. The transition at the rising edge 610 of the input signal I1 is detected as a start of a shift event, and the transition at the rising edge 620 of the output signal I2 is detected as an end of the shift event. The transition at the falling edge 710 of the input signal I1 is detected as a start of another shift event, and the transition at the falling edge 720 of the output signal I2 is detected as an end of the another shift event.

That is to say, in the embodiment of FIG. 7, a transition at one of a rising edge and a falling edge of the input signal can be detected as the start of shift events, and a transition at the other one of the rising edge and the falling edge of the output signal can be detected as the end of shift events.

Figure 8:
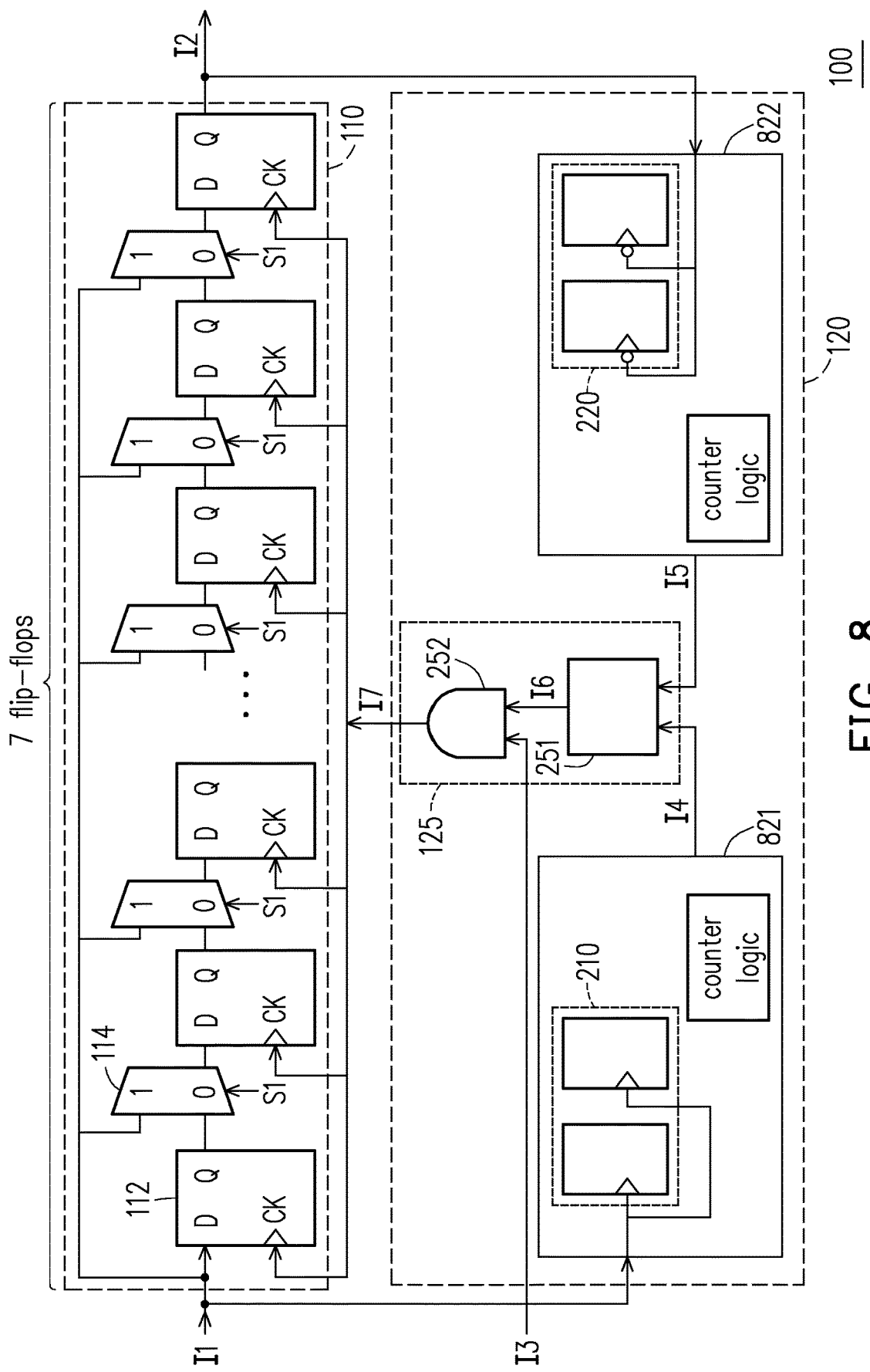
FIG. 8 illustrates a schematic diagram of a shift register circuit according to another embodiment of the invention.

FIG. 8 illustrates a schematic diagram of a shift register circuit according to another embodiment of the invention. Referring to FIG. 8, circuit structures of the first counter circuit 821 and the second counter circuit 822 are further disclosed. The rising edge of input signal I1 is used to trigger the first counter circuit 821, and the falling edge of output signal I2 is used to trigger the second counter circuit 822. That is to say, the input signal I1 serves as a clock for positive-edge triggered flip-flops 210 in the first counter circuit 821, and the output signal I2 serves as a clock for negative-edge triggered flip-flops 220 in the second counter circuit 822. Therefore, additional detector circuits for detecting the input signal I1 and the output signal I2 are not required.

Figure 9:
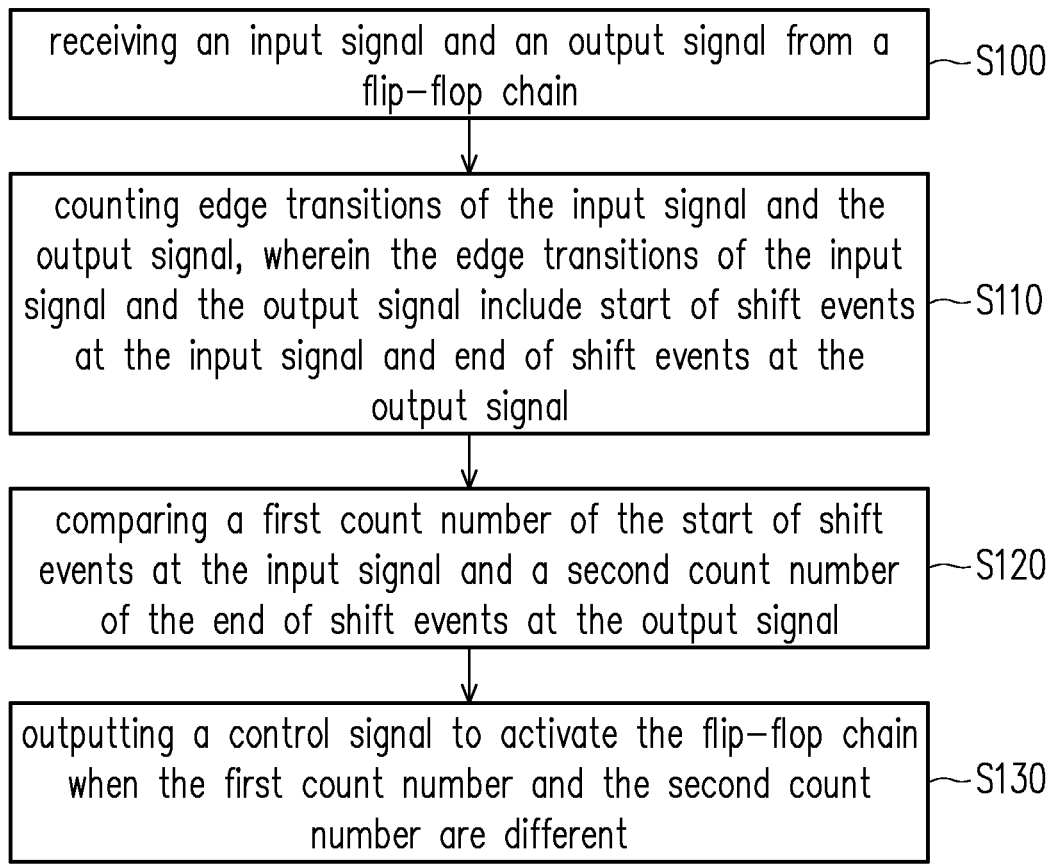
FIG. 9 is a flowchart illustrating steps in a method for controlling a shift register circuit according to an embodiment of the invention.

FIG. 9 is a flowchart illustrating steps in a method for controlling a shift register circuit according to an embodiment of the invention. Referring to FIG. 1 and FIG. 9, the method for controlling a shift register circuit of the present embodiment is at least adapted to the shift register circuit 100 of FIG. 1, but the invention is not limited thereto. Taking the shift register circuit 100 for example, in step S100, the control circuit 120 receives an input signal I1 and an output signal I2 from the flip-flop chain 110. In step S110, the control circuit 120 counts edge transitions of the input signal I1 and the output signal I2, wherein the edge transitions of the input signal I1 and the output signal I2 include start of shift events at the input signal I1 and end of shift events at the output signal I2. In step S120, the control circuit 120 compares a first count number of the start of shift events at the input signal I1 and a second count number of the end of shift events at the output signal I2. In step S130, the control circuit 120 outputs a control signal I7 to activate the flip-flop chain 110 when the first count number and the second count number are different.

In addition, sufficient teaching, suggestion, and implementation illustration regarding the method for controlling a shift register circuit of the embodiments of the invention may be obtained from the foregoing embodiments of FIG. 1 to FIG. 8, and thus related description thereof is not repeated hereinafter.

In summary, in the embodiments of the invention, the control circuit outputs the control signal to activate the flip-flop chain when the input and output counts are different. Therefore, the flip-flop chain does not always work, such that the power consumption of the shift register circuit can be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A shift register circuit, comprising:
   a flip-flop chain configured to receive an input signal and output an output signal; and
   a control circuit coupled to the flip-flop chain and configured to receive the input signal and the output signal, and output a control signal to activate the flip-flop chain according to edge transitions of the input signal and the output signal,
   wherein the edge transitions of the input signal and the output signal comprise start of shift events at the input signal and end of shift events at the output signal, and
   the control circuit counts the start of shift events at the input signal and the end of shift events at the output signal, and the control circuit outputs the control signal to activate the flip-flop chain when a first count number of the start of shift events at the input signal and a second count number of the end of shift events at the output signal are different.

2. The shift register circuit of claim 1, wherein the control circuit comprises:
   a first counter circuit coupled to the flip-flop chain and configured to receive the input signal, count the start of shift events at the input signal and output the first count number; and
   a second counter circuit coupled to the flip-flop chain and configured to receive the output signal, count the end of shift events at the output signal and output the second count number.

3. The shift register circuit of claim 2, wherein the control circuit further comprises:
   a comparator circuit coupled to the first counter circuit and the second counter circuit and configured to receive and compare the first count number and the second count number and output the control signal to activate the flip-flop chain when the first count number and the second count number are different.

4. The shift register circuit of claim 3, wherein the comparator circuit outputs the control signal further according to an input clock.

5. The shift register circuit of claim 1, wherein he control circuit receives an input clock and outputs the control signal further according to an input clock.

6. The shift register circuit of claim 2, wherein the control circuit further comprises:
   a first detector circuit coupled to the flip-flop chain and the first counter circuit and configured to detect the input signal and an output signal of a flip-flop of the flip-flop chain and output a first detecting signal to the first counter circuit, wherein the first detecting signal indicates the start of shift events at the input signal; and
   a second detector circuit coupled to the flip-flop chain and the second counter circuit and configured to detect the output signal and output a second detecting signal to the second counter circuit, wherein the second detecting signal indicates the edge transition of the output signal.

7. The shift register circuit of claim 1, wherein the start of shift events at the input signal indicates a change of value of the input signal, and the end of shift events at the output signal indicates a change of value of the output signal.

8. The shift register circuit of claim 7, wherein a transition at a rising edge and a falling edge of the input signal is detected as the start of shift events, and a transition at a rising edge and a falling edge of the output signal is detected as the end of shift events.

9. The shift register circuit of claim 7, wherein a transition at one of a rising edge and a falling edge of the input signal is detected as the start of shift events, and a transition at the other one of the rising edge and the falling edge of the output signal is detected as the end of shift events.

10. A method for controlling a shift register circuit, wherein the shift register circuit comprises a flip-flop chain, the method comprising:
- receiving an input signal and an output signal from the flip-flop chain;
- counting edge transitions of the input signal and the output signal, wherein the edge transitions of the input signal and the output signal comprise start of shift events at the input signal and end of shift events at the output signal;
- comparing a first count number of the start of shift events at the input signal the input signal and a second count number of the end of shift events at the output signal; and
- outputting a control signal to activate the flip-flop chain when the first count number and the second count number are different.

11. The method for controlling the shift register circuit of claim 10, further comprising:
- detecting the input signal and an output signal of a flip-flop of the flip-flop chain and outputting a first detecting signal to be counted, wherein the first detecting signal indicates the start of shift events at the input signal; and
- detecting the output signal and outputting a second detecting signal to be counted, wherein the second detecting signal indicates the edge transition of the output signal.

12. The method for controlling the shift register circuit of claim 2, wherein the start of shift events at the input signal indicates a change of value of the input signal, and the end of shift events at the output signal indicates a change of value of the output signal.

13. The method for controlling the shift register circuit of claim 12, wherein a transition at a rising edge and a falling edge of the input signal is detected as the start of shift events, and a transition at a rising edge and a falling edge of the output signal is detected as the end of shift events.

14. The method for controlling the shift register circuit of claim 12, wherein a transition at one of a rising edge and a falling edge of the input signal is detected as the start of shift events, and a transition at the other one of the rising edge and the falling edge of the output signal is detected as the end of shift events.

15. The method for controlling the shift register circuit of claim 12, further comprising:
- receiving an input clock and outputting the control signal further according to an input clock.

\* \* \* \* \*